(12) United States Patent
Park et al.

(10) Patent No.: US 8,237,460 B1
(45) Date of Patent: Aug. 7, 2012

(54) POGO PIN INSERTING DEVICE FOR TESTING SEMICONDUCTOR DEVICES AND METHOD THEREFOR

(75) Inventors: Myeong Seong Park, Gwangsan-Gu (KR); Dae Seong Mun, Gwangsan-Gu (KR); Kyung Suk Ko, Seo-Gu (KR)

(73) Assignee: Amkor Technology, Inc., Chandler, AZ (US)

( * ) Notice: Subject to any disclaimer, the term of this patent is extended or adjusted under 35 U.S.C. 154(b) by 403 days.

(21) Appl. No.: 12/708,385

(22) Filed: Feb. 18, 2010

(51) Int. Cl.
*G01R 31/00* (2006.01)
*G01R 1/067* (2006.01)

(52) U.S. Cl. .................................................. 324/755.11

(58) Field of Classification Search .................. None
See application file for complete search history.

(56) References Cited

U.S. PATENT DOCUMENTS

| | | | | |
|---|---|---|---|---|
| 5,176,289 A * | 1/1993 | Klossner et al. | | 221/168 |
| 7,598,523 B2 * | 10/2009 | Luo et al. | | 257/48 |
| 8,127,429 B2 * | 3/2012 | Saito et al. | | 29/596 |
| 2010/0246152 A1 * | 9/2010 | Lin et al. | | 361/783 |
| 2011/0057819 A1 * | 3/2011 | Ide et al. | | 341/100 |
| 2011/0080185 A1 * | 4/2011 | Wu et al. | | 324/750.3 |
| 2011/0292708 A1 * | 12/2011 | Kang et al. | | 365/63 |
| 2012/0012841 A1 * | 1/2012 | Chang et al. | | 257/48 |
| 2012/0018723 A1 * | 1/2012 | Su et al. | | 438/18 |

FOREIGN PATENT DOCUMENTS

JP 03270246 A * 12/1991

* cited by examiner

*Primary Examiner* — Jermele M Hollington
(74) *Attorney, Agent, or Firm* — Weiss & Moy, P.C.; Jeffrey D. Moy

(57) ABSTRACT

A pogo pin inserting device for testing a semiconductor device has a pin feeder for storing a plurality of pogo pins. A socket mounting device has a socket mounted thereon, wherein the plurality of pogo pins is loaded into the socket by the pin feeder. A magnetic field applying device applies a magnetic field to the socket to allow the plurality of pogo pins loaded onto the socket to be inserted into the socket in one of a forward or backward direction. An air blowing portion supplies the socket with air to eject backwardly inserted pogo pins from the socket.

20 Claims, 12 Drawing Sheets

POGO PIN INSERTING DEVICE FOR TESTING SEMICONDUCTOR DEVICES AND METHOD THEREFOR

FIELD OF THE INVENTION

This invention relates to a semiconductor device testing device and, more specifically, to a pogo pin inserting device for testing a semiconductor device and a method therefor.

BACKGROUND OF THE INVENTION

In general, electrical characteristics of semiconductor dies on a wafer are inspected using a testing device by an electrical die sorting (EDS) process before they are packaged. Electrical characteristics of semiconductor packages including the packaged semiconductor dies are also tested. The tests are basically performed to verify whether semiconductor wafers or packages have been manufactured to meet certain performance criteria.

In recent years, a test socket using pogo pins or spring pins has been widely used for testing highly integrated semiconductor devices. In the test socket, the pogo pins electrically connect semiconductor devices to be tested with a test board.

To this end, a number of pogo pins need to be manually inserted into the test socket. In this connection, however, since lengths and diameters of the respective pogo pins are very small, it is not easy to manually inserting the pogo pins into the test socket, which is a time consuming and labor intensive task.

Therefore, a need existed to provide a system and method to overcome the above problem.

SUMMARY OF THE INVENTION

A pogo pin inserting device for testing a semiconductor device has a pin feeder for storing a plurality of pogo pins. A socket mounting device has a socket mounted thereon, wherein the plurality of pogo pins is loaded into the socket by the pin feeder. A magnetic field applying device applies a magnetic field to the socket to allow the plurality of pogo pins loaded onto the socket to be inserted into the socket in one of a forward or backward direction. An air blowing portion supplies the socket with air to eject backwardly inserted pogo pins from the socket.

A method for inserting pogo pins, comprising: supplying a socket with a plurality of pogo pins; applying a magnetic field to the socket to allow the pogo pins to be inserted into the socket in one of a forward or backward directions; securing forwardly inserted pogo pins in the socket; and disengaging backwardly inserted pogo pins from the socket.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
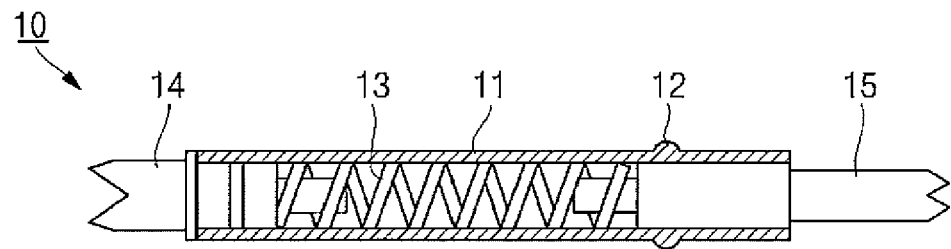
FIG. 1 is a partially cross-sectional view illustrating a pogo pin for testing a semiconductor device according to an embodiment of the present invention.

Referring to FIG. 1, there is illustrated a partially cross-sectional view of a pogo pin 10 for testing a semiconductor device according to an embodiment of the present invention. The pogo pins 10 includes a hollow cylindrical pipe 11, a spring 13 coupled to an inner surface of the cylindrical pipe 11, a semiconductor contact portion 14 coupled to one side of the spring 13 in the cylindrical pipe 11, and a board contact portion 15 coupled to the other side of the spring 13 in the cylindrical pipe 11.

In the present embodiment, the cylindrical pipe 11 has a protrusion 12. That is to say, the protrusion 12 is formed on the outer surface of the cylindrical pipe 11, at which the cylindrical pipe 11 overlaps the board contact portion 15. In other words, the protrusion 12 is closer to the board contact portion 15 than to the semiconductor contact portion 14.

The cylindrical pipe 11, the semiconductor contact portion 14 and the board contact portion 15 may be formed of BeCu alloy, and the spring 13 may be formed of Fe, but the invention is not limited thereto. The use of these materials makes the cylindrical pipe 11, the semiconductor contact portion 14 and the board contact portion 15 diamagnetic and the spring 13 magnetic. Not only the spring 13 but also the cylindrical pipe 11, the semiconductor contact portion 14, and the board contact portion 15 may be made to be magnetic.

Meanwhile, the semiconductor contact portion 14 is a region electrically contact to a semiconductor device or a semiconductor package (not shown) and the board contact portion 15 is a region electrically contact to a test board (not shown).

Referring to FIGS. 2A through 2G, there are illustrated conceptual views illustrating a method of inserting pogo pins into a test socket for testing a semiconductor device according to an embodiment of the present invention.

Figure 2A:
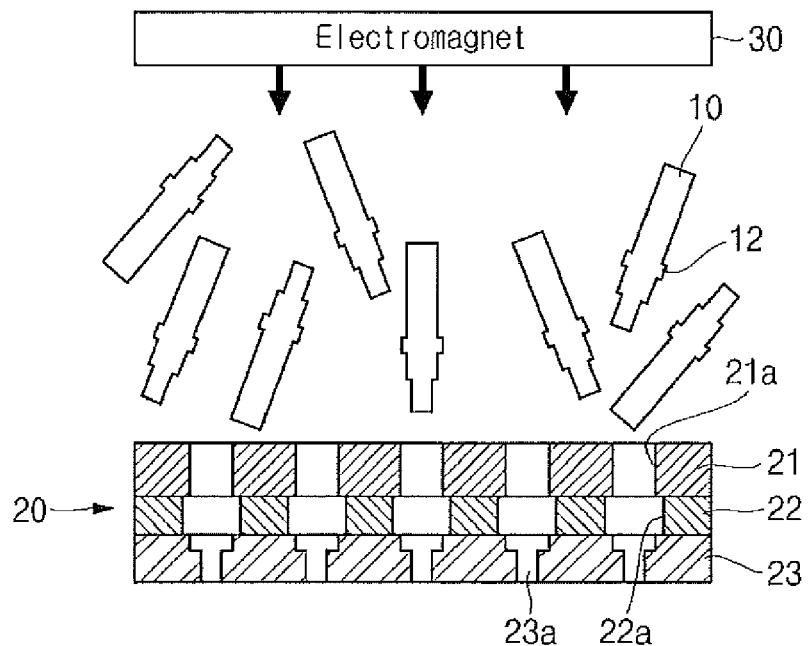
FIGS. 2A through 2G are conceptual views illustrating a method of inserting pogo pins into a test socket for testing a semiconductor device according to an embodiment of the present invention.

As shown in FIG. 2A, in the feeding of unaligned pins, a plurality of unaligned pogo pins 10 are supplied to a socket 20. Each of the plurality of pogo pins 10 is substantially the same as that shown in FIG. 1, and briefly illustrated for a better understanding of the invention. However, protrusions 12 formed on the respective pogo pins 10 are illustrated in FIG. 2A.

The socket 20 includes a top plate 21 having a plurality of holes 21a, a middle plate 22 having a plurality of holes 22a and configured to slide in one direction, and a bottom plate 23 having a plurality of holes 23a. In practice, the holes 21a of the top plate 21, the holes 22a of the middle plate 22, and the holes 23a of the bottom plate 23 are interconnected, and the pogo pins 10 are engaged with the holes 21a, 22a, and 23a. In addition, diameters of the holes 21a, 22a, and 23a are greater than those of the corresponding protrusions 120 of the pogo pins 10. In particular, diameters of the holes 22a formed in the middle plate 22 are larger than those of the holes 21a or 23a formed in the top plate 21 or the bottom plate 23. The middle plate 22 is configured to slidably move between the top plate 21 and the bottom plate 23 by a distance. However, the distance is considerably smaller than a pitch between each of the holes 21a, 22a, and 23a. In practice, the distance needs only have a length required for fixing the pogo pins 10 inserted by the middle plate 22 in a forward direction.

In addition, the plurality of pogo pins 10 are supplied by means of an electromagnet 30. That is to say, in a state in which the plurality of pogo pins 10 are electromagnetically attracted and adsorbed by the action of the electromagnet 30, as power of the electromagnet 30 is turned off, the plurality of pogo pins 10 drop from the electromagnet 30 to then be loaded into the socket 20. Here, the number of pogo pins 10 loaded into the socket 20 is greater than that of pogo pins that can be inserted into the holes 21a, 22a, and 23a of the socket 20. For example, assuming that the number of the holes 21a, 22a, and 23a formed in the socket 20 is approximately 100, approximately 110-170 pogo pins 10 may be supplied to the socket 20. Within this range, almost all of the pogo pins 10 can be inserted into the holes 21a, 22a, and 23a of the socket 20 and the inserting of the pogo pins 10 is also efficiently performed.

Figure 2B:
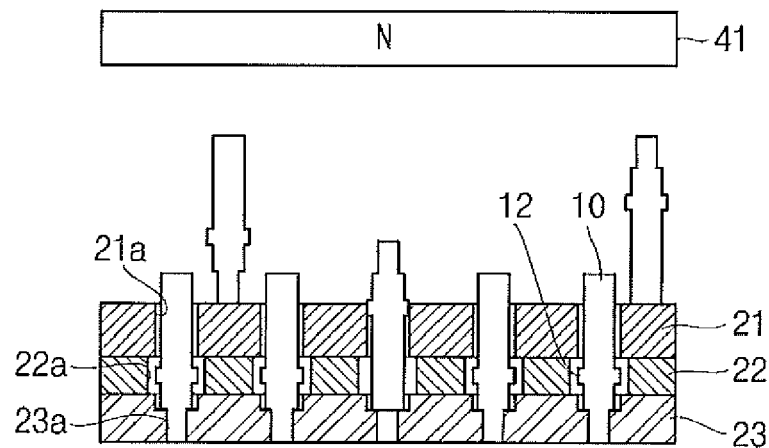

As illustrated in FIG. 2B, in the inserting of the pogo pins 10, as a magnetic field is applied to the socket 20, the pogo pins 10 are inserted into the socket 20 in forward or backward directions.

For example, an N-pole permanent magnet 41 is positioned above the socket 20, and a permanent magnet 42 of a south (S) pole is positioned below the socket 20, socket 20. The pogo pins 10 loaded into the socket 20 are then allowed to stand in a direction from S pole to N pole or vice versa. In other words, since the spring made of iron (Fe) disposed within each of the pogo pins 10 is made of a magnetic material, the pogo pins 10 stand substantially perpendicular to a direction in which a magnetic field is supplied from the permanent magnets 41 and 42. Some of the pogo pins 10 are inserted into the holes 21a, 22a, and 23a formed in the socket 20. Here, the pogo pins 10 are inserted into the holes 21a, 22a, and 23a of the socket 20 in forward or backward directions.

If the protrusion 12 formed on each of the pogo pins 10 is positioned on the middle plate 22, the pogo pins are defined as forwardly inserted pogo pins. If the protrusion 12 formed on each of the pogo pins 10 is positioned on the top plate 21, the pogo pins are defined as backwardly inserted pogo pins.

The inserting of the pogo pins 10 is performed in multiple cycle times, and a direction in which the magnetic field is applied to the socket 20 is reversed by approximately 180° in every cycle. In practice, the pair of permanent magnets 41 and 42 are rotated by 180°, thereby changing the direction of the magnetic field applied to the socket 20. As the inserting of the pogo pins 10 is performed in multiple cycle times, the number of pogo pins 10 inserted into the holes 21a, 22a, and 23a of the socket 20 increases. In order to further increase the number of pogo pins 10 inserted into the holes 21a, 22a, and 23a of the socket 20, the socket 20 reciprocates horizontally between the pair of permanent magnets 41 and 42 in multiple times.

Figure 2C:
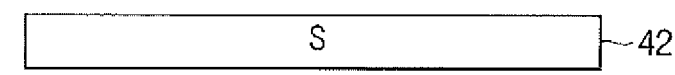
Figure 2C:
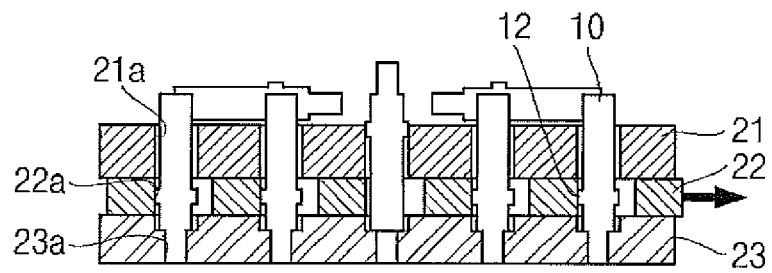

As illustrated in FIG. 2C, in the fixing of the inserted pins, the pogo pins 10 inserted into the socket 20 are fixed. Among the pogo pins 10 inserted into the socket 20, only the forwardly inserted pogo pins are fixed. That is say, the protrusions 12 of the forwardly inserted pogo pins 10 are positioned in the holes 22a in the middle plate 22 of the socket 20. On the contrary, the protrusion 12 of the backwardly inserted pogo pin 10 is positioned in the hole 21a in the top plate 21 of the socket 20. In such a state, when the middle plate 22 of the socket 20 slightly slides in a horizontal direction, as indicated by an arrow, the internal wall of the hall 22a of the middle plate 22 is brought into close contact with the protrusions 12 of the forwardly inserted pogo pins 10. In addition, bottoms of the forwardly inserted pogo pin 10 closely contact the holes 23a of the bottom plate 23. However, the internal wall of the hole 22a of the middle plate 22 does not closely contact the backwardly inserted pogo pin 10, and the bottom end of the backwardly inserted pogo pin 10 is not brought into close contact with the hole 23a of the bottom plate 23 either. Accordingly, if high-pressure air is supplied from a lower portion of the socket 20, the forwardly inserted pogo pins 10 are not disengaged from the socket 20 but the backwardly inserted pogo pins 10 are all disengaged from the socket 20.

Figure 2D:
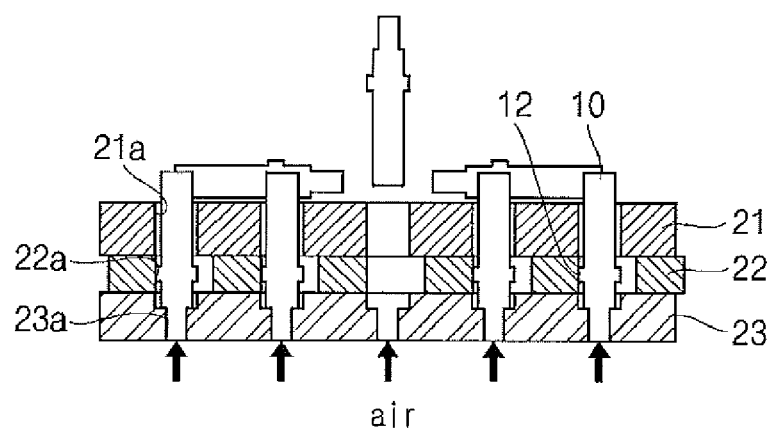

As illustrated in FIG. 2D, in the disengaging of pins, the backwardly inserted pogo pin 10 is disengaged from the socket 20. In detail, high-pressure air is supplied from the lower portion of the socket 20. Then, the forwardly inserted pogo pins 10 are not disengaged from the socket 20 but the backwardly inserted pogo pin 10 is disengaged upwardly from the socket 20.

Figure 2E:
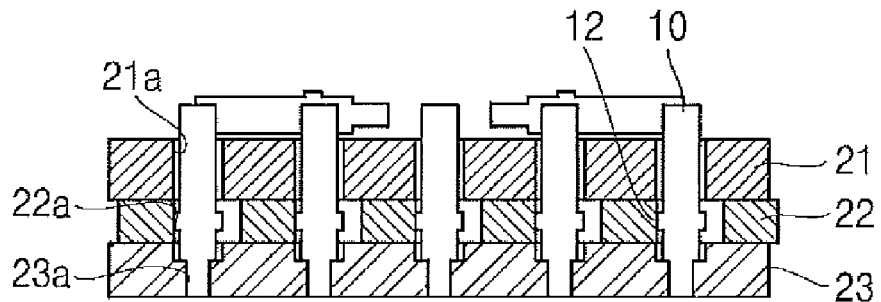

The inserting of the pogo pins 10 into the socket 20 by applying a magnetic field to the socket 20, the fixing of the inserted pogo pins 10, and the removing of the backwardly inserted pogo pins 10 by supplying the high-pressure air thereto are repeatedly performed approximately 1 to 10 times. By doing so, as illustrated in FIG. 2E, approximately 90 to 100% of the forwardly inserted pogo pins 10 are inserted into the socket 20.

Since the direction of the magnetic field applied in the inserting of each cycle is reversed and the socket 20 reciprocates horizontally within the magnetic field, a proportion of the pogo pins 10 inserted into the socket 20 may further increase.

Figure 2F:
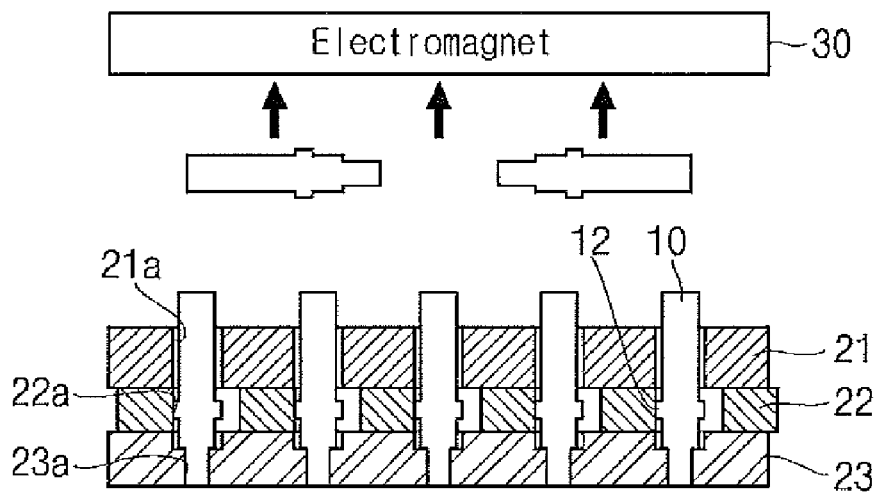

As illustrated in FIG. 2F, in the removing of uninserted pins, the remaining pogo pins 10, which are not inserted into the socket 20, are removed. That is to say, since more pogo pins 10 than inserted into the socket 20 have been supplied in the feeding of pins, leftover pogo pins 10 exist in the socket 20 without being inserted into the holes 21a, 22a, and 23a of the socket 20. The uninserted pogo pins 10 are electromagnetically attracted and adsorbed by the electromagnet 30 for removal.

Figure 2G:
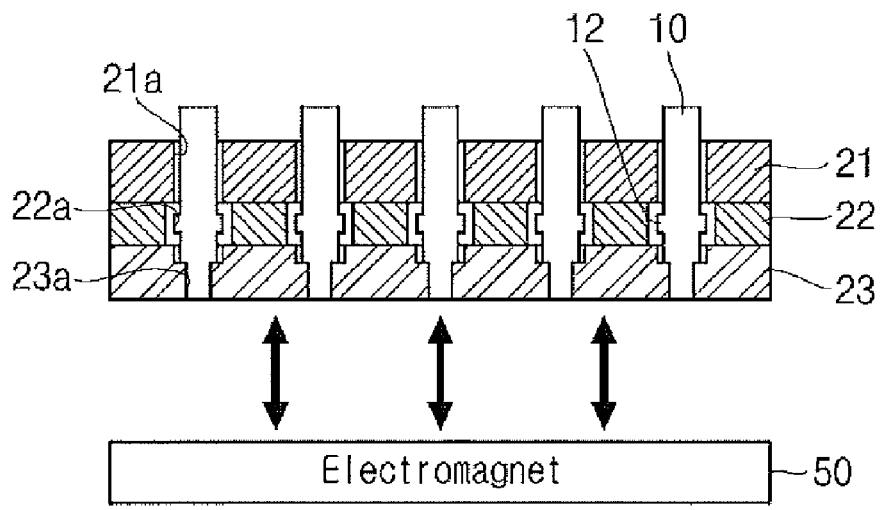

As illustrated in FIG. 2G, in the demagnetizing, the pogo pins 10 inserted into the socket 20 are demagnetized. In other words, since the spring disposed within each of the pogo pins 10 is made of a magnetic material, the spring itself is magnetized to an extent with an external magnetic force applied. Since iron (Fe) based, particulate foreign materials may stick to the pogo pins 10, the magnetized pogo pins 10 become demagnetized by means of a demagnetizing member 50 supplied with alternating magnetic fields of several tens of hertz (Hz) to several tens of kilohertz (Hz) in frequencies. To this end, the socket 20 may be positioned on the demagnetizing member 50. Then, the spring of each of the pogo pins 10 returns to its original state in which its molecular orientations are randomized, and the spring becomes demagnetized.

The thus-obtained pogo pins 10 are transferred to the test socket. In other words, after removing the top plate 21 from the socket 20, all of the pogo pins 10 forwardly inserted into the middle plate 22 and the bottom plate 23 are absorbed into a vacuum tool (not shown) and transferred to a test socket (not shown) for being assembled.

Figure 3A:
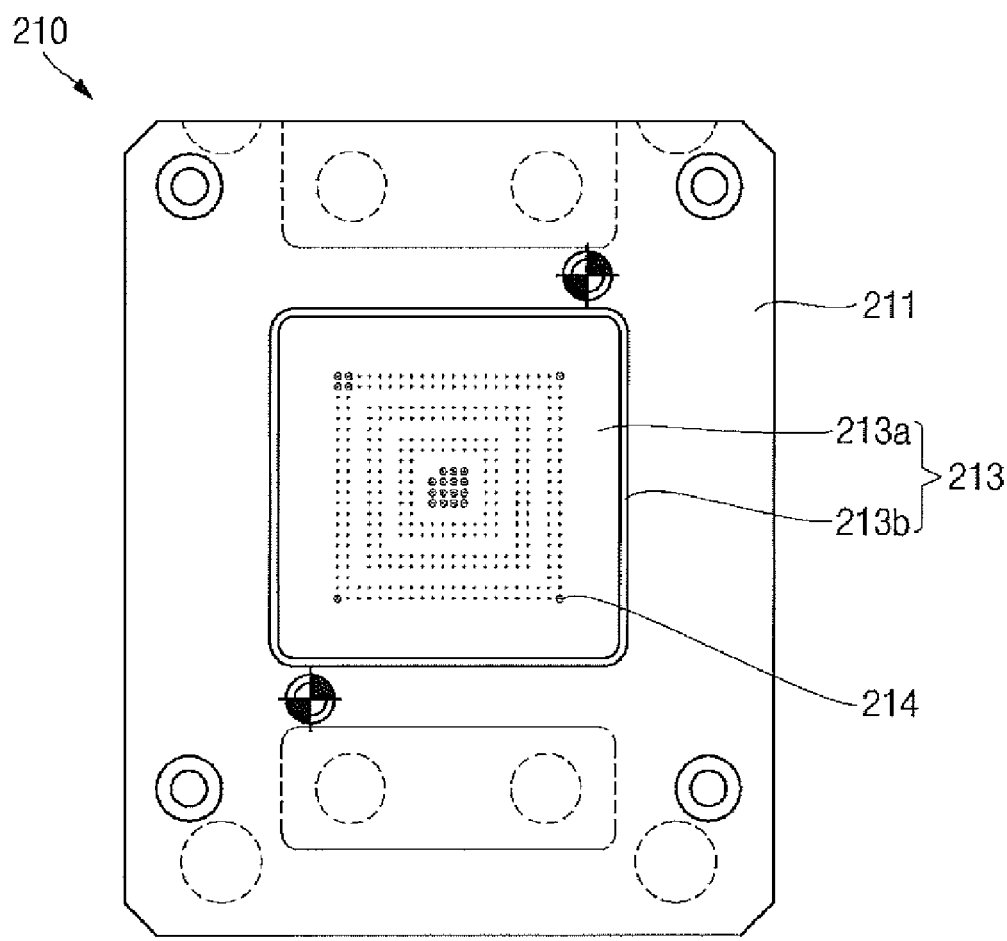
FIG. 3A is a plan view illustrating a top plate of the test socket.
Figure 3B:
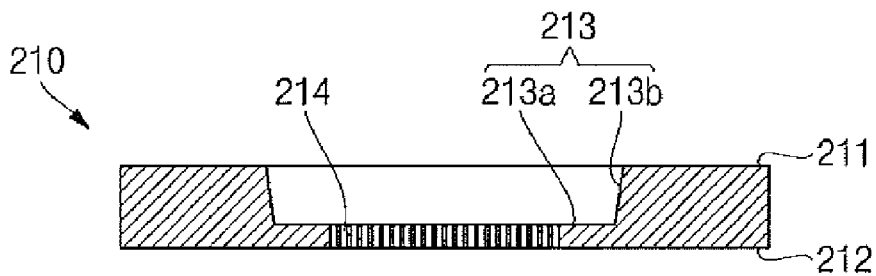
FIG. 3B is a cross-sectional view illustrating the top plate of the test socket.

As shown in FIGS. 3A and 3B, the top plate 210 includes a first surface 211 that is substantially planar, a second surface 212 that is opposed to the first surface 211 and is substantially planar, and a cavity 213 having a given depth and formed in the first surface 211. The cavity 213 has a bottom surface 213a and sidewalls 213b, and a plurality of holes 214 formed between the bottom surface 213a and the second surface 212. Here, a plurality of unaligned pogo pins is supplied to the cavity 213. Here, the plurality of unaligned pogo pins is inserted into the plurality of holes 214 using the above-described inserting process.

Figure 4A:
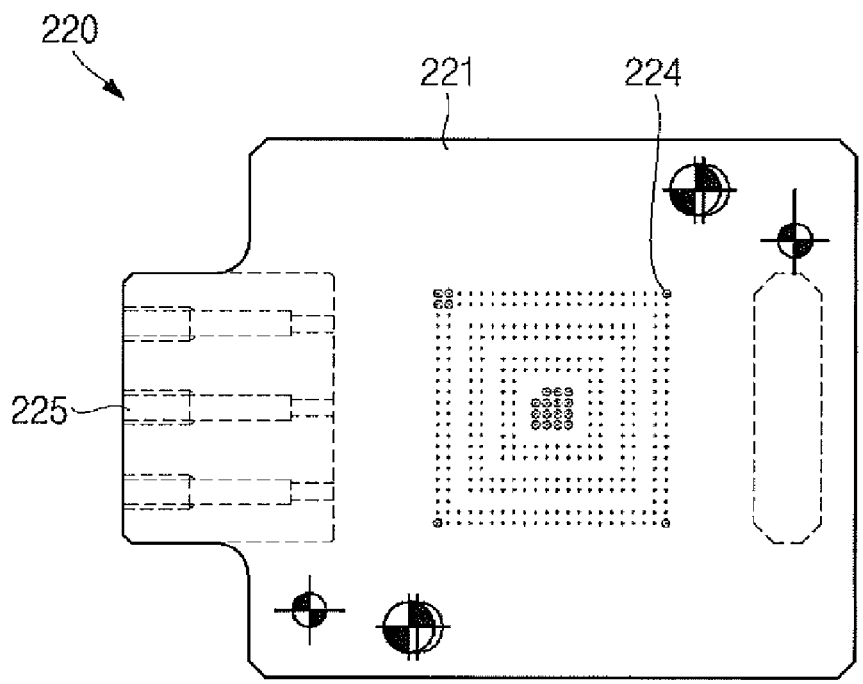
FIG. 4A is a plan view of a middle plate of the test socket.
Figure 4B:
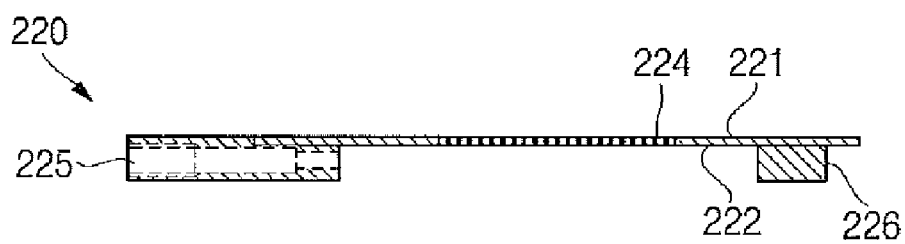
FIG. 4B is a cross-sectional view illustrating the middle plate of the test socket.

As shown in FIGS. 4A and 4B, the middle plate 220 includes a first surface 221 that is substantially planar, a second surface 222 that is opposed to the first surface 221 and is substantially planar, and a plurality of holes 224 between the first surface 221 and the second surface 222. A diameter of each of the plurality of holes 224 is greater than that of each of the plurality of holes 214 formed in the top plate 210. Meanwhile, pneumatic supply portions 225 are arranged in rows at one side of the second surface 222 of the middle plate 220. A stopper 226 protruding downward is provided at the other side of the second surface 222 of the middle plate 220. The pneumatic supply portions 225 allow the middle plate 220 to slide a predetermined distance in a horizontal direction, and the stopper 226 limits a sliding distance of the middle plate 220 to less than the predetermined distance. Here, the pogo pins are inserted into the holes 224.

Figure 5A:
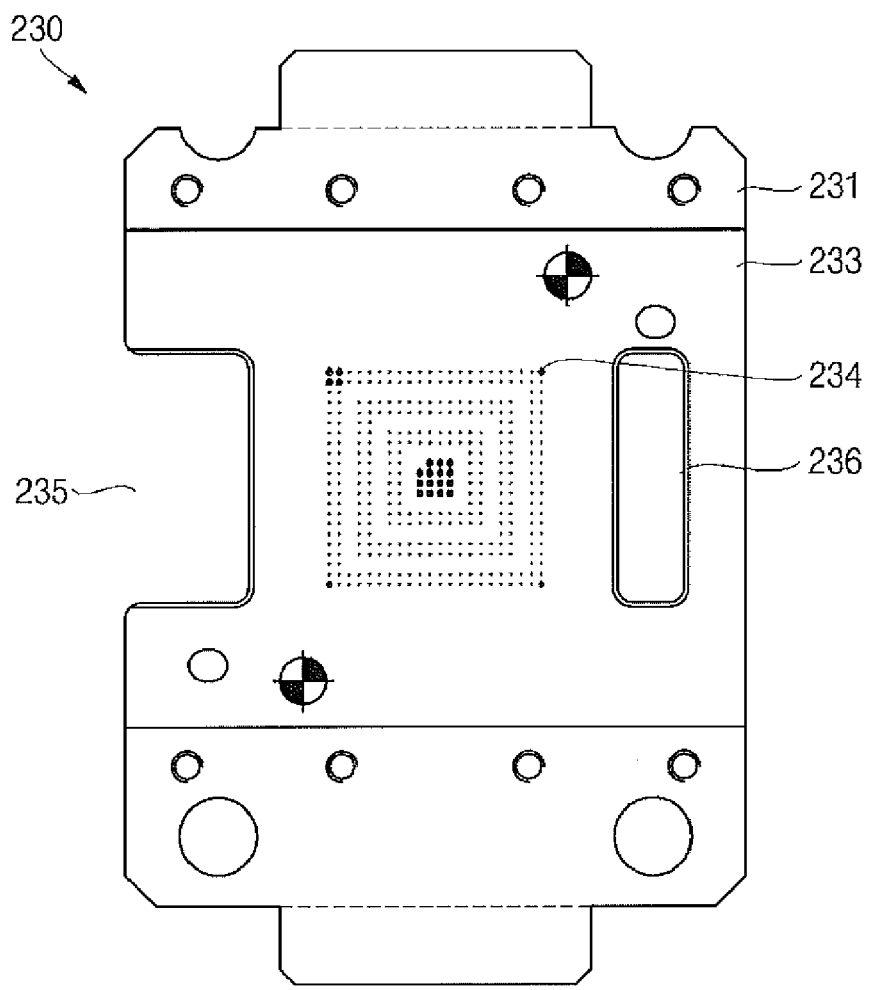
FIG. 5A is a plan view illustrating a bottom plate of the test socket.
Figure 5B:
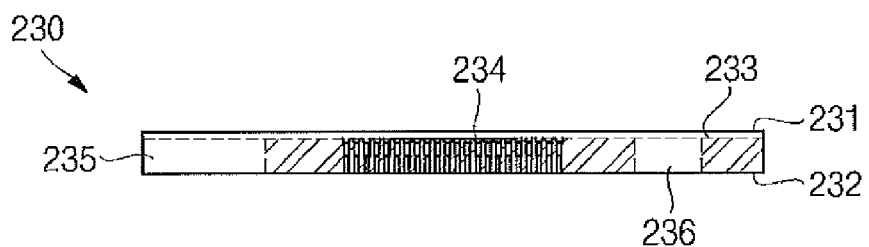
FIG. 5B is a cross-sectional view illustrating the bottom plate of the test socket.

As shown in FIGS. 5A and 5B, the bottom plate 230 includes a first surface 231 that is substantially planar, and a second surface 232 that is opposed to the first surface 231 and is substantially planar. The bottom plate 230 further includes a third surface 233 between the first surface 231 and the second surface 232. In addition, a plurality of holes 234 are formed between the second surface 232 and the third surface 233.

A diameter of each of the plurality of holes 234 is smaller than that of each of the plurality of holes 224 formed in the middle plate 220. A cut portion 235 is formed such that the pneumatic supply portion 225 of the middle plate 220 is positioned at a side of the second surface 232 and the third surface 233, and a stopping hole 236 is formed at the opposite side of the second surface 232 and the third surface 233 to be engaged with the stopper 226 of the middle plate 220. A horizontal length of the stopping hole 236 is greater than that of the stopper 226. The middle plate 220 is seated on the third surface 233 of the bottom plate 230 and slides along the third surface 233. Here, the middle plate 220 is guided by a boundary area between the first surface 231 and the third surface 233 of the bottom plate 230. The pogo pins are inserted into the plurality of holes 234.

Figure 6A:
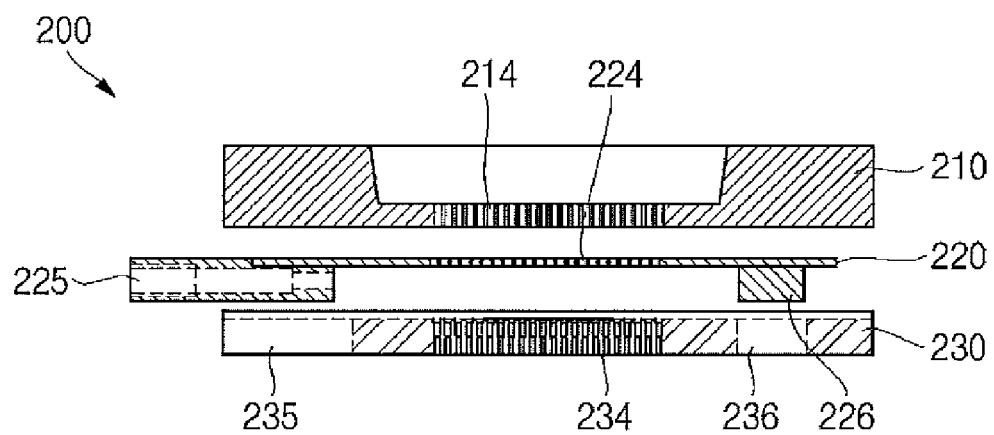
FIG. 6A is an exploded cross-sectional view of the test socket.

As shown in FIG. 6A, a middle plate 220 is positioned on a bottom plate 230. Here, a pneumatic supply portion 225 of the middle plate 220 is positioned on a cut portion 235 of the bottom plate 230, and a stopper 226 of the middle plate 220 is engaged with a stopping hole 236 of the bottom plate 230. A top plate 210 is positioned on the middle plate 220. Holes 214 of the top plate 210, holes 224 of the middle plate 220, and holes 234 of the bottom plate 230 are connected with one another, and pogo pins are inserted into the interconnected holes 214, 224 and 234.

Figure 6B:
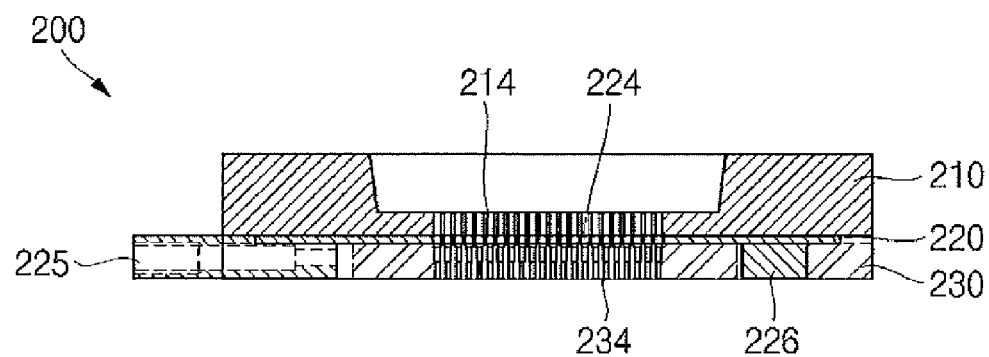
FIG. 6B is an assembled cross-sectional views of the test socket.

As shown in FIG. 6B, in the feeding of unaligned pogo pins and the inserting of pogo pins, the holes 214 of the top plate 210, the holes 224 of the middle plate 220, and the holes 234 of the bottom plate 230 perfectly coincide with one another. In other words, midpoints of the respective holes 214, 224, and 234 are the same with each other. Accordingly, pogo pins are easily inserted into the holes 214, 224 and 234 in forward or backward directions.

Figure 6C:
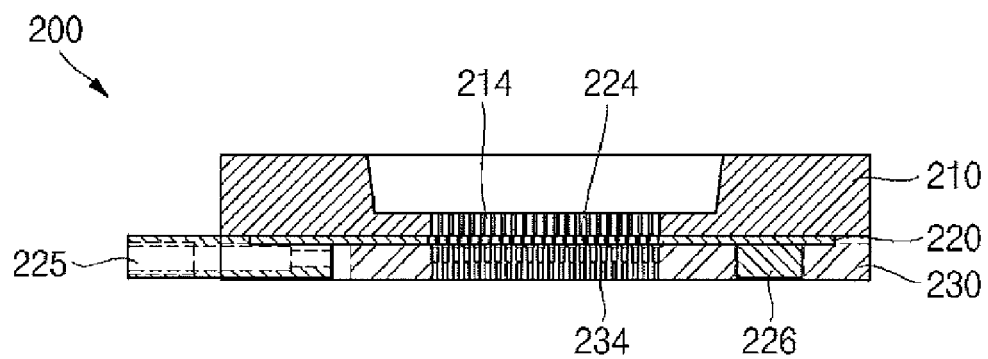
FIG. 6C is an assembled cross-sectional views of the test socket.

As shown in FIG. 6C, in the fixing of inserted pogo pins, the disengaging of pogo pins, the removing of pogo pins and the demagnetizing, the holes 214 of the top plate 210, the holes 224 of the middle plate 220, and the holes 234 of the bottom plate 230 do not perfectly coincide with one another. That is to say, as the middle plate 220 slightly slides in a horizontal direction, the midpoint of the holes 224 of the middle plate 220 and the midpoint of the holes 234 of the bottom plate 230 miss each other.

Accordingly, the pogo pins forwardly inserted into the holes 214, 224 and 234 may not disengage to the outside. In more detail, since the holes 224 of the middle plate 220 closely contact the protrusions of the forwardly inserted pogo pins, the forwardly inserted pogo pins may not disengage to the outside. However, since the protrusion of the backwardly inserted pogo pin is positioned in the hole 214 of the top plate 210 or outside (specifically above) the hole 214 of the top plate 210, other than the holes 224 of the middle plate 220, the backwardly inserted pogo pins may disengage to the outside.

Here, the socket 200 shown in FIG. 6B may be in the presence of a pneumatic pressure supplied to the pneumatic supply portion 225 of the middle plate 220. On the other hand, the socket 200 shown in FIG. 6C may be in the absence of a pneumatic pressure supplied to the pneumatic supply portion 225 of the middle plate 220. That is to say, in the socket 200 shown in FIG. 6C, if the pneumatic pressure is not supplied to the pneumatic supply portion 225 of the middle plate 220, the middle plate 220 slidably moves, and the midpoints of the respective holes 214, 224 and 234 do not coincide with one another. However, if the pneumatic pressure is supplied to the pneumatic supply portion 225 of the middle plate 220, the middle plate 220 returns to its original position, so that the midpoints of the respective holes 214, 224 and 234 may coincide with one another. In order to supply a pneumatic pressure to the pneumatic supply portion 225 of the middle plate 220, a spring (not shown) may be provided between the middle plate 220 and the bottom plate 230.

Figure 7A:
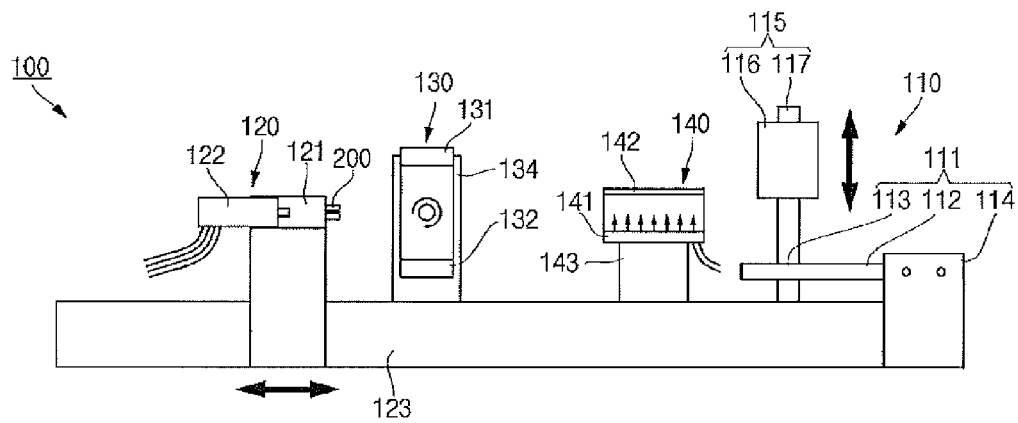
FIG. 7A is a plan view illustrating a pogo pin inserting apparatus for testing a semiconductor device according to an embodiment of the present invention.
Figure 7B:
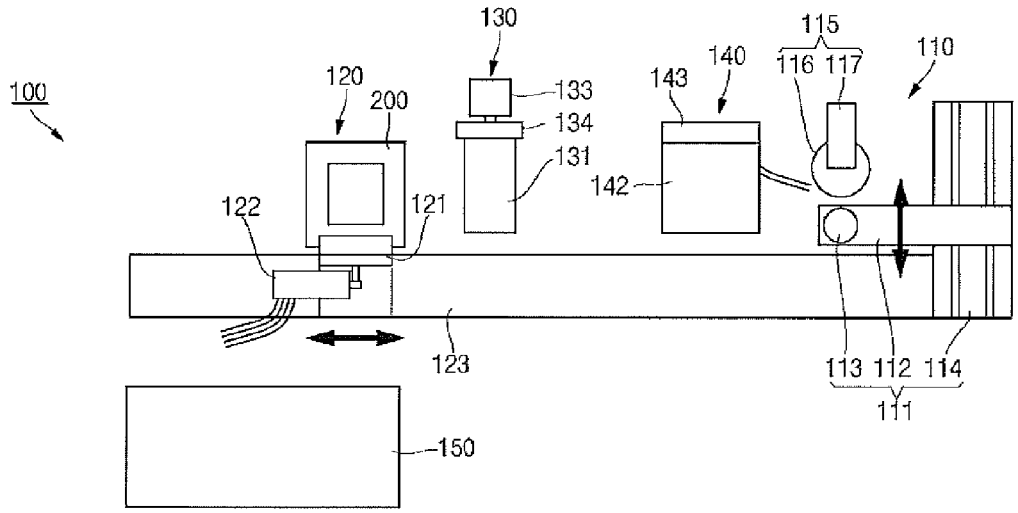
FIG. 7B is a cross-sectional view illustrating a pogo pin inserting apparatus for testing a semiconductor device according to an embodiment of the present invention.

As shown in FIGS. 7A and 7B, the pogo pin inserting device 100 includes a pin feeder/ejector 110, a socket mounting portion 120, a magnetic field applying portion 130, an air blowing portion 140, and a demagnetizing portion 150.

The pin feeder/ejector 110 supplies unaligned pogo pins to the socket 200 of the socket mounting portion 120, or ejects uninserted pogo pins from the socket 200.

In order to perform the supplying or ejecting of the pogo pins, the pin feeder/ejector 110 includes a pin mounting portion 111 and a pin pickup/drop portion 115. The pin mounting portion 111 includes a plate 112 having a pin receiving portion 113, and a rail block 114 connected to the plate 112. Here, the plate 112 connected to the rail block 114 moves back and forth (that is, in a horizontal direction). More pogo pins than received by the socket 200 are seated in the pin mounting portion 111 either manually or automatically. The pin pickup/drop portion 115 is installed in rear of the pin mounting portion 111, and includes an electromagnet 116 and a rail block 117. The electromagnet 116 moves up and down along the rail block 117 (that is, in a vertical direction). If power is applied to the electromagnet 116, the electromagnet 116 adsorbs the pogo pins seated in the pin receiving portion 113 or the pogo pins that are not inserted into the socket 200. Then, if power supply is interrupted, the electromagnet 116 drops the adsorbed pogo pins into the pin receiving portion 113 or the socket 200.

The socket mounting portion 120 includes a clamping block 121 for fixing the socket 200, a pneumatic supply portion 122, and a rail block 123. The clamping block 121 clamps the socket 200. The pneumatic supply portion 122 supplies a middle plate of the socket 200 with a pneumatic pressure to allow the middle plate to slide in a horizontal direction. In addition, the rail block 123 allows the clamping block 121 to move toward the magnetic field applying portion 130, the air blowing portion 140 and the pin feeder/ejector 110. In other words, the clamping block 121 moves along the rail block 123 in left and right directions (that is, in a horizontal direction). Since a configuration of the socket 200 has already been described, a repeated explanation thereof will not be given.

The magnetic field applying portion 130 applies a magnetic field to the socket 200 to allow unaligned pogo pins to be inserted into the socket 200 in forward or backward directions. To this end, the magnetic field applying portion 130 includes a pair of permanent magnets 131 and 132, a rotating portion 133 for rotating the permanent magnets 131 and 132 by 180°, and a supporting block 134 for supporting the permanent magnets 131 and 132 and the rotating portion 133. The pair of permanent magnets 131 and 132 is installed at locations corresponding to upper and lower portions of the socket 200, respectively, and induce magnetic fields of different polarities. For example, if the upper permanent magnet 131 is installed to supply an N-pole magnetic field to the socket 200, the lower permanent magnet 132 is installed to supply an S-pole magnetic field to the socket 200. The rotating portion 133 may be a general motor or a pneumatic cylinder. Here, the socket mounting portion 120 reciprocates approximately 1-10 times horizontally between the permanent magnets 131 and 132, thereby increasing insertion efficiency of the pogo pins.

The air blowing portion 140 supplies the socket 200 with air to eject backwardly inserted pogo pins. To this end, the air blowing portion 140 includes a pneumatic supply portion 141, a pin disengaging prevention portion 142 and a supporting block 143. The pneumatic supply portion 141 is installed at a location corresponding to a lower portion of the socket 200, and supplies the lower portion of the socket 200 with air. The pin disengaging prevention portion 142 is installed at a location corresponding to an upper portion of the socket 200, and prevents the pogo pins separated from the socket 200 from being disengaged to the outside.

In order to demagnetize the pogo pins engaged with the socket 200, the demagnetizing portion 150 supplies the socket 200 with alternating magnetic fields of high frequency. To this end, the socket 200 is first separated from the socket mounting portion 120 to then be positioned on the demagnetizing portion 150. Next, as power is applied to the demagnetizing portion 150, alternating magnetic fields ranging from several tens of hertz (Hz) to several tens of kilohertz (kHz) in frequencies are supplied to the socket 200, thereby demagnetizing the pogo pins engaged with the socket 200.

Figure 8A:
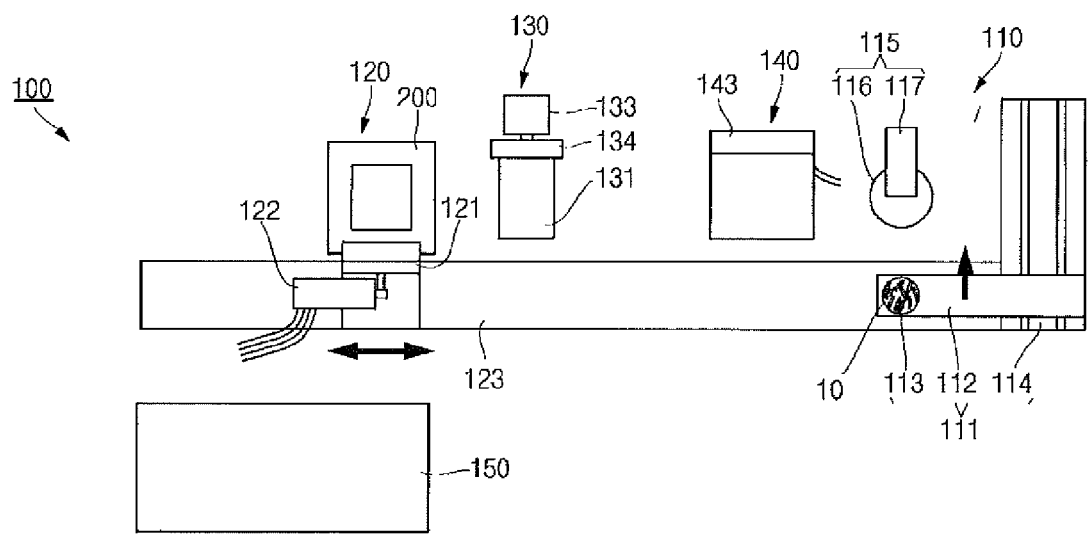
FIGS. 8A through 8H are plan view and a cross-sectional view illustrating a pogo pin inserting apparatus for testing a semiconductor device according to an embodiment of the present invention and a method of using thereof.
Figure 8B:
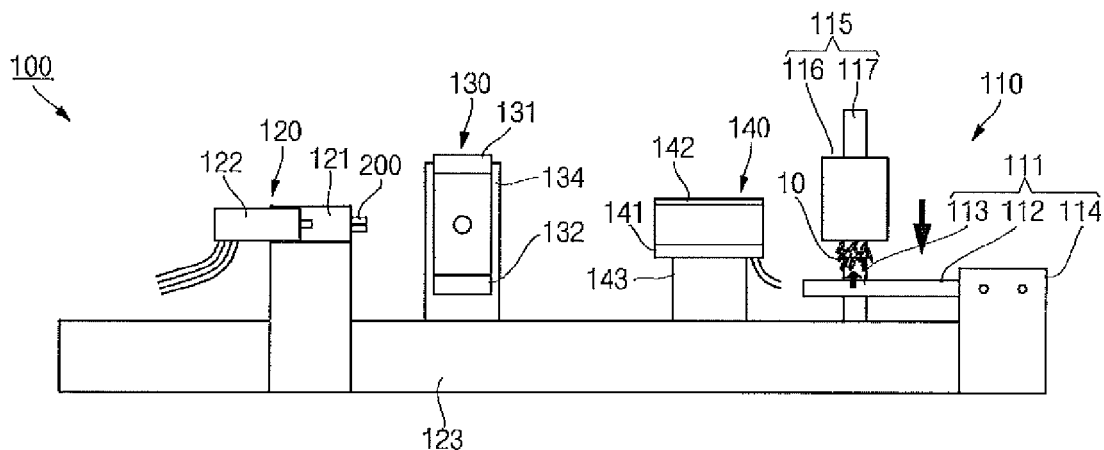

As shown in FIGS. 8A and 8B, the pin feeder/ejector 110 is first actuated, and a greater number of pogo pins 10 than required are then received and seated in the pin receiving portion 113 of the pin mounting portion 111. Next, the plate 112 of the pin mounting portion 111 is moved rearward along the rail block 114. In other words, the pin receiving portion 113 is moved downward relative to the electromagnet 116 of the pin pickup/drop portion 115. Then, the electromagnet 116 is lowered along the rail block 117. Next, power is applied to the electromagnet 116. As a result, the plurality of pogo pins 10 is adsorbed into the electromagnet 116. Thereafter, the electromagnet 116 moves upward along rail block 117.

Figure 8C:
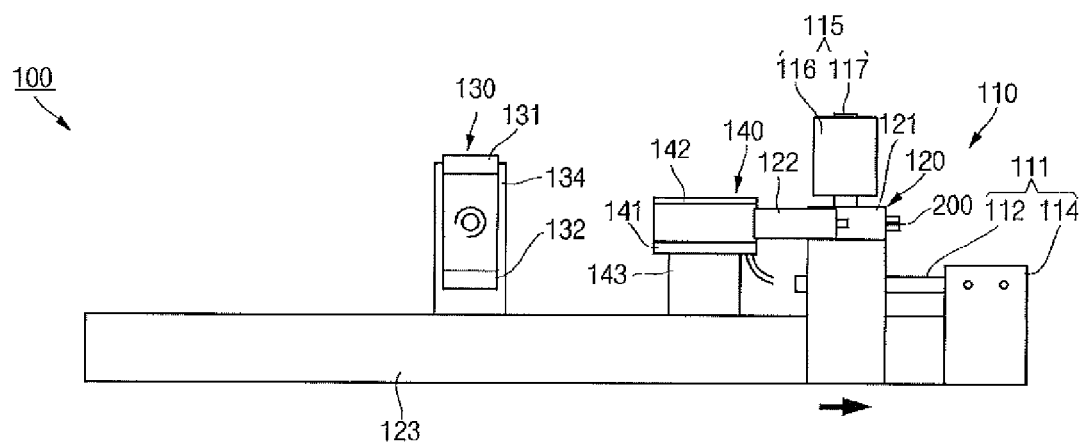

As shown in FIG. 8C, the socket mounting portion 120 is moved rightward along the rail block 123 to be positioned on the pin feeder/ejector 110. In other words, the socket 200 is positioned under the electromagnet 116 of the pin pickup/drop portion 115. Then, the power applied to the electromagnet 116 is turned off. Accordingly, the pogo pins 10 adsorbed into the socket 200. That is to say, unaligned pogo pins 10 are loaded into the socket 200.

Figure 8D:
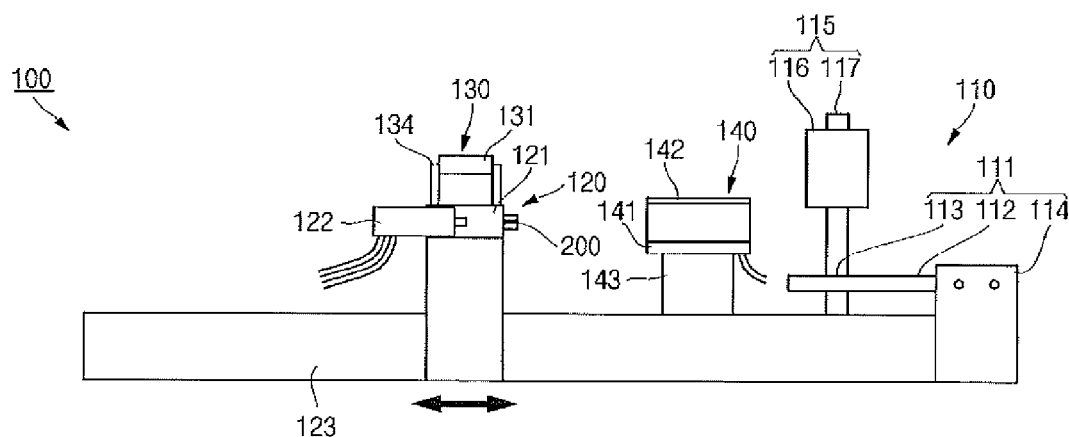

As shown in FIG. 8D, the socket mounting portion 120 is moved leftward along the rail block 123 to be positioned on the magnetic field applying portion 130. The socket mounting portion 120 reciprocates in view of the magnetic field applying portion 130 in left and right directions, that is, in a horizontal direction, approximately 1-10 times between the permanent magnets 131 and 132. In such a manner, the pogo pins are inserted into the socket 200 in forward or backward directions. In more detail, the pogo pins are inserted into holes formed in the socket 200 in forward or backward directions.

Figure 8E:
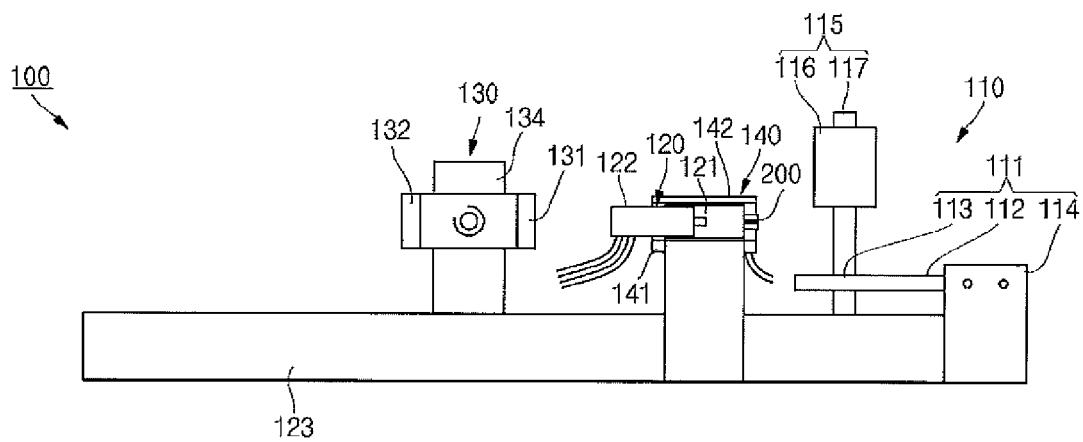

As shown in FIG. 8E, the socket mounting portion 120 is moved rightward along the rail block 123 to be positioned on the air blowing portion 140. The air blowing portion 140 upwardly blows air from a lower portion of the socket 200, thereby allowing the pogo pins backwardly inserted into the socket 200 from being separated from the socket 200. Here, the pin disengaging prevention portion 142 prevents the pogo pins separated from the socket 200 from being disengaged to the outside. The reason of the pogo pins forwardly inserted into the socket 200 has already been described, and a repeated explanation will not be given.

Meanwhile, the pair of permanent magnets 131 and 132 of the magnetic field applying portion 130 is rotated by the rotating portion 133 by approximately 180°. Accordingly, a direction in which the magnetic field is applied to the magnetic field applying portion 130 is reversed by approximately 180°.

Next, the socket mounting portion 120 further moves horizontally toward the magnetic field applying portion 130, followed by reciprocating in view of the magnetic field applying portion 130 in left and right directions approximately 1-10 times.

In addition, the socket mounting portion 120 performs reciprocal left and right movements between the magnetic field applying portion 130 and the air blowing portion 140 approximately 1-10 times. As a result, most of the pogo pins in the socket 200 are forwardly inserted ones.

Figure 8F:
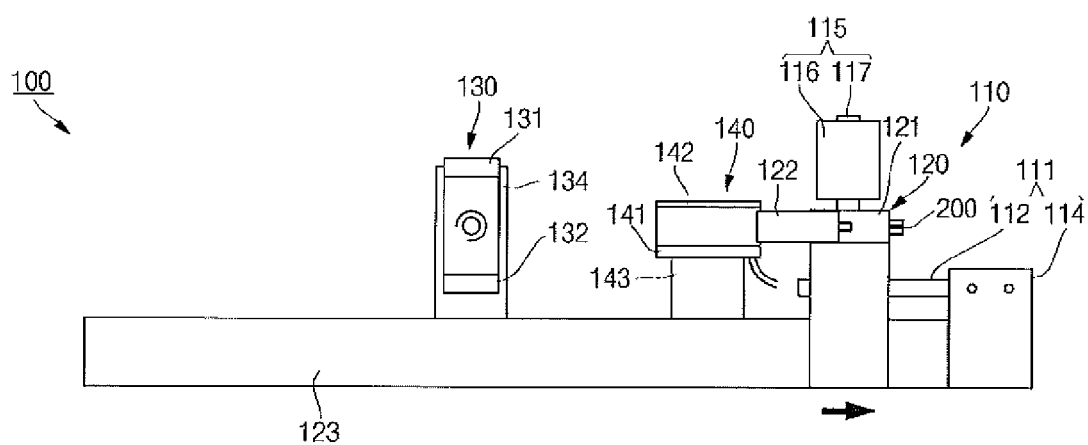

As shown in FIG. 8F, the socket mounting portion 120 is moved rightward along the rail block 123 to then be positioned on the pin feeder/ejector 110. Then, the electromagnet 116 of the pin pickup/drop portion 115 is lowered by a certain distance along the rail block 117 and power is applied to the electromagnet 116, thereby allowing leftover pogo pins 10 remaining in the socket 200 to be absorbed into the electromagnet 116.

Figure 8G:
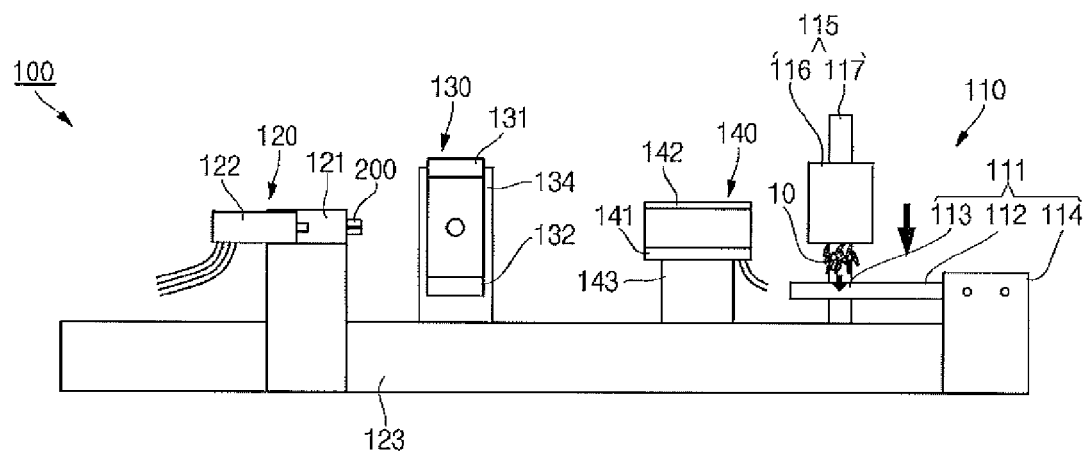

As shown in FIG. 8G, socket mounting portion 120 is moved leftward along the rail block 123. Next, the plate 112 of the pin mounting portion 111 is moved rearward along the rail block 114 to then be positioned below the electromagnet 116. Finally, the power of the electromagnet 116 is turned off.

Then, the pogo pins 10 adsorbed into the electromagnet 116 are all made to fall down to the pin receiving portion 113 of the plate 112.

Figure 8H:
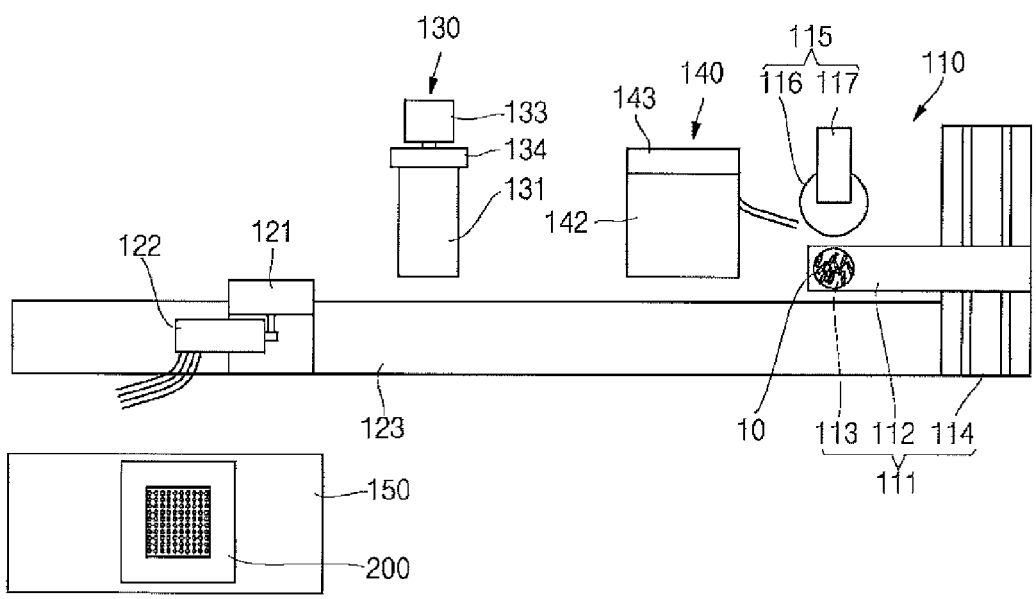

As shown in FIG. 8H, the socket 200 is separated from the socket mounting portion 120 to then be positioned on the demagnetizing portion 150. When the power is applied to the demagnetizing portion 150, alternating magnetic fields of several tens of hertz (Hz) to several tens of kilohertz (kHz) in frequencies are supplied to the socket 200, thereby demagnetizing the pogo pins.

As described above, the socket 200 is basically kept at a state in which the middle plate is slidably moved in one direction. That is to say, the socket 200 is basically configured such that the midpoint of the hole of the middle plate does not coincide with midpoints of the holes of the, top plate and the bottom plate. Thus, a pneumatic pressure is supplied only when the socket mounting portion 120 is positioned on the magnetic field applying portion 130, that is, when the midpoint of the hole of the middle plate coincides with midpoints of the holes of the, top plate and the bottom plate. In other words, when the socket mounting portion 120 is not positioned on the magnetic field applying portion 130, the supplying of the pneumatic pressure is interrupted, so that the middle plate slightly slides in a lateral direction. Accordingly, the forwardly inserted pogo pins are not separated from the socket 200 even by the air blown from the air blowing portion 140 or the magnetic force applied from the electromagnet 116.

After completing the above described process, the top plate is separated from the socket 200. Next, all of the pogo pins forwardly inserted into the middle plate and the bottom plate are absorbed into a vacuum tool (not shown) to then be transferred to a test socket.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A pogo pin inserting device for testing a semiconductor device, the pogo pin inserting device comprising:
   a pin feeder storing a plurality of pogo pins;
   a socket mounting device having a socket mounted thereon, the plurality of pogo pins loaded into the socket by the pin feeder;
   a magnetic field applying device applying a magnetic field to the socket to allow the plurality of pogo pins loaded onto the socket to be inserted into the socket in one of a forward or backward direction; and
   an air blowing portion supplying the socket with air to eject backwardly inserted pogo pins.

2. The pogo pin inserting device of claim 1, wherein the pin feeder comprises:
   a movable pin mounting device on which the plurality of pogo pins is stored; and
   a movable pin pickup and drop device to pick up the pogo pins from the pin mounting portion and to drop the pogo pins in the socket, and to pick up non-inserted pogo pins from the socket and to drop the non-inserted pogo pins in the pin mounting portion.

3. The pogo pin inserting device of claim 2, wherein the pin pickup and drop device is an electromagnet.

4. The pogo pin inserting device of claim 1, wherein the socket comprises:
   a top plate having a cavity, wherein the cavity has a plurality of holes formed there through to allow the plurality of pogo pins to be inserted in one of a forward or backward direction;
   a middle plate positioned under the top plate and having a plurality of holes into which the pogo pins are inserted; and
   a bottom plate positioned under the middle plate and having a plurality of holes into which the pogo pins are inserted;
   wherein the middle plate is connected to the bottom plate and moves to fix the forward inserted pogo pins.

5. The pogo pin inserting device of claim 4, wherein diameters of the holes formed in the middle plate are larger than the holes formed in the top plate and the bottom plate.

6. The pogo pin inserting device of claim 4, wherein the socket mounting device further comprises a pneumatic supply device to move the middle plate.

7. The pin inserting device of claim 1, wherein the magnetic field applying device comprises:
   a pair of permanent magnets, wherein a first permanent is positioned on an upper section of the socket and a second permanent magnet is positioned to a lower section of the socket, the pair of permanent magnets inducing magnetic fields of different polarities; and
   a rotating device rotating the pair of permanent magnets.

8. The pogo pin inserting device of claim 1, wherein the air blowing device comprises:
   a blowing device positioned below the socket and supplying the socket with air; and
   a pin disengaging prevention device positioned on an upper portion of the socket to prevent the pogo pins from becoming disengaged from the pogo pin inserting device.

9. The pogo pin inserting device of claim 1, further comprising a demagnetizing device for supplying the socket with alternating magnetic fields of high frequency.

10. A method for inserting pogo pins, comprising:
    supplying a socket with a plurality of pogo pins;
    applying a magnetic field to the socket to allow the pogo pins to be inserted into the socket in one of a forward or backward directions;
    securing forwardly inserted pogo pins in the socket; and
    disengaging backwardly inserted pogo pins from the socket.

11. The method of claim 10 further comprising removing non-inserted pogo pins from the socket.

12. The method of claim 10, wherein the inserting of the pogo pins comprises applying magnetic fields of different polarities to upper and lower portions of the socket.

13. The method of claim 10, wherein the fixing of the inserted pins comprises:
    forming protrusions on one side of each of the pogo pins, wherein the forwardly inserted pogo pins and the backwardly inserted pogo pins have protrusions at different locations; and
    using the protrusions formed on the forwardly inserted pogo pins to fix the forwardly inserted pogo pins within the socket.

14. The method of claim 10, wherein the disengaging of pogo pins comprises blowing air to disengage backwardly inserted pogo pins from the socket.

15. The method of claim 11, wherein the removing of leftover pogo pins comprises absorbing uninserted pogo pins by an electromagnet.

16. The method of claim 10, further comprising demagnetizing the pogo pins inserted into the socket.

17. A pogo pin inserting device for testing a semiconductor device, the pogo pin inserting device comprising:
- a socket having a cavity, wherein a plurality of pogo pins is loaded into the cavity;
- a magnetic field applying device to apply a magnetic field to the socket to allow the plurality of pogo pins to be inserted into the socket in one of a forward or backward direction; and
- an air blowing portion supplying the socket with air to eject backwardly inserted pogo pins.

18. The pogo pin inserting device of claim 17, wherein the socket comprises:
- a top plate having a cavity, wherein the cavity has a plurality of holes formed there through to allow the plurality of pogo pins to be inserted in one of a forward or backward direction;
- a middle plate positioned under the top plate and having a plurality of holes into which the pogo pins are inserted; and
- a bottom plate positioned under the middle plate and having a plurality of holes into which the pogo pins are inserted;
- wherein the middle plate is connected to the bottom plate and moves to fix the forward inserted pogo pins in the socket.

19. The pogo pin inserting device of claim 17, wherein the plurality of pogo pins have protrusions formed on one side of each of the pogo pins, wherein the protrusions are used to fix the forwardly inserted pogo pins within the socket.

20. The pogo pin inserting device of claim 17, further comprising:
- a pin feeder storing a plurality of pogo pins, to drop the pogo pins in the socket, and to pick up non-inserted pogo pins from the socket; and
- a demagnetizing device for supplying the socket with alternating magnetic fields of high frequency.

* * * * *